United States Patent
Narramore et al.

(10) Patent No.: US 10,339,228 B2
(45) Date of Patent: Jul. 2, 2019

(54) AERODYNAMIC ANALYSIS FOR QUALITY ASSURANCE OF MANUFACTURED PARTS

(75) Inventors: Jimmy Charles Narramore, Austin, TX (US); Donald W. Axley, Keller, TX (US); George R. Decker, Fort Worth, TX (US); Benjamin M. Green, Fort Worth, TX (US)

(73) Assignee: Bell Helicopter Textron Inc., Fort Worth, TX (US)

(*) Notice: Subject to any disclaimer, the term of this patent is extended or adjusted under 35 U.S.C. 154(b) by 1122 days.

(21) Appl. No.: 13/356,821

(22) Filed: Jan. 24, 2012

(65) Prior Publication Data

US 2013/0190914 A1    Jul. 25, 2013

(51) Int. Cl.
| | | |
|---|---|---|
| G05B 15/00 | (2006.01) | |
| G05B 15/02 | (2006.01) | |
| G05B 19/00 | (2006.01) | |
| G06F 17/50 | (2006.01) | |

(52) U.S. Cl.
CPC ................. *G06F 17/5009* (2013.01)

(58) Field of Classification Search
CPC .. G05B 15/00; G05B 19/00; G05B 19/41875; G05B 2219/32019; G05B 2219/32083; G05B 2219/32184; F03D 1/0675; F03D 1/0641; B64C 27/473
USPC .......................................................... 700/105
See application file for complete search history.

(56) References Cited

U.S. PATENT DOCUMENTS

| | | | |
|---|---|---|---|
| 3,938,762 A | | 2/1976 | Murphy |
| 4,935,277 A | | 6/1990 | Le Balc'h |
| 5,465,221 A | * | 11/1995 | Merat ............. G05B 19/41875 700/160 |
| 6,134,485 A | * | 10/2000 | Tanielian et al. ............... 701/14 |
| 6,285,968 B1 | * | 9/2001 | Motoyama .......... G06F 17/5018 702/100 |
| 6,320,272 B1 | * | 11/2001 | Lading .................. F03D 7/0224 290/44 |
| 6,481,964 B2 | | 11/2002 | Lorkowski et al. |
| 6,522,993 B1 | * | 2/2003 | Tomko .................. G01B 11/24 700/195 |
| 6,553,333 B1 | * | 4/2003 | Shenk .......................... 702/182 |
| 6,644,919 B2 | | 11/2003 | Bauer et al. |
| 6,749,152 B2 | | 6/2004 | Bebesel et al. |
| 7,092,845 B2 | * | 8/2006 | Keane et al. ................. 702/182 |
| 7,497,663 B2 | | 3/2009 | McRae, Jr. et al. |
| 8,065,111 B1 | * | 11/2011 | Gonzalez ..................... 702/182 |
| 10,053,238 B1 | * | 8/2018 | Schilling ............. G01M 5/0016 |
| 2002/0016651 A1 | * | 2/2002 | Cunningham et al. ....... 700/302 |

(Continued)

OTHER PUBLICATIONS

Communication from European Patent Office in Germany pursuant to Article 94(3) EPC, Application No. 12 157 284.6-1960, Ref. JL62605P.EPP, dated Feb. 25, 2014.

(Continued)

*Primary Examiner* — Ronald D Hartman, Jr.
(74) *Attorney, Agent, or Firm* — Baker Botts L.L.P.

(57) ABSTRACT

According to one embodiment, a quality analyzer receives aerodynamic performance data for a part that has been manufactured according to a design. The aerodynamic performance data expresses aerodynamic performance of the part as calculated from a plurality of coordinates measured on the part. The quality analyzer determines whether the aerodynamic performance data for the part satisfies minimum aerodynamic performance requirements.

17 Claims, 3 Drawing Sheets

(56) References Cited

U.S. PATENT DOCUMENTS

| | | | |
|---|---|---|---|
| 2007/0104582 A1* | 5/2007 | Rahai | F03D 3/061 |
| | | | 416/197 A |
| 2009/0049377 A1* | 2/2009 | Moore | 715/275 |
| 2009/0074574 A1* | 3/2009 | Godsk | F03D 1/0641 |
| | | | 416/41 |
| 2010/0153058 A1* | 6/2010 | Crothers | B23Q 17/20 |
| | | | 702/150 |
| 2010/0208247 A1* | 8/2010 | Bosselmann et al. | 356/237.1 |
| 2011/0081226 A1 | 4/2011 | Wobben | |
| 2011/0110778 A1 | 5/2011 | Lim et al. | |
| 2011/0142634 A1 | 6/2011 | Menke et al. | |
| 2012/0229792 A1* | 9/2012 | Fuglsang | F03D 7/0224 |
| | | | 356/28 |
| 2014/0190011 A1* | 7/2014 | Tanaka | F01D 5/14 |
| | | | 29/889.2 |
| 2015/0211482 A1* | 7/2015 | Radisek | F03D 3/061 |
| | | | 416/135 |
| 2018/0170515 A1* | 6/2018 | Kordel | B64C 3/50 |
| 2018/0172435 A1* | 6/2018 | Robson | G01B 21/20 |

OTHER PUBLICATIONS

Extended European Search Report; Application No. 12157284.6-2224; pp. 7, dated May 23, 2012.
Zachos et al.; "Turbine Blading Performance Evaluation Using Geometry Scanning and Flowfield Prediction Tools"; Journal of Power and Energy Systems, vol. 2, No. 6; pp. 14, May 19, 2008.
Lanzafame et al.; "Fluid dynamics wind turbine design: Critical analysis, optimization and application of BEM theory"; Renewable Energy, vol. 32; pp. 2291-2305, 2007.
Canadian Intellectual Property Office, Application No. 2,802,213, Examiner's Requisition dated Jul. 23, 2015, 5 pages.

\* cited by examiner

AERODYNAMIC ANALYSIS FOR QUALITY ASSURANCE OF MANUFACTURED PARTS

TECHNICAL FIELD

This invention relates generally to quality assurance of manufactured parts, and more particularly, to aerodynamic analysis for quality assurance of manufactured parts.

BACKGROUND

Manufacturing is the use of machines, tools, and/or labor to produce goods for use or sale. In some circumstances, goods may be manufactured for use in more complex products. For example, a helicopter rotor blade or airplane wing section may be manufactured for use in an aircraft.

SUMMARY

According to one embodiment, a quality analyzer receives aerodynamic performance data for a part that has been manufactured according to a design. The aerodynamic performance data expresses aerodynamic performance of the part as calculated from a plurality of coordinates measured on the part. The quality analyzer determines whether the aerodynamic performance data for the part satisfies minimum aerodynamic performance requirements.

Particular embodiments of the present disclosure may provide one or more technical advantages. A technical advantage of one embodiment may include the capability to perform quality assurance tests based on the aerodynamic performance of manufactured parts. A technical advantage of one embodiment may include the capability to remove point-specific tolerances from quality approval criteria. A technical advantage of one embodiment may include reducing time spent on secondary aerodynamic analysis and approval of manufactured parts that failed point-specific tolerances. A technical advantage of one embodiment may also include the capability to identify flaws in manufacturing processes. A technical advantage of one embodiment may also include the capability to identify modifications to failed manufactured parts to allow the failed manufactured parts to satisfy aerodynamic performance requirements Certain embodiments of the present disclosure may include some, all, or none of the above advantages. One or more other technical advantages may be readily apparent to those skilled in the art from the figures, descriptions, and claims included herein.

BRIEF DESCRIPTION OF THE DRAWINGS

For a more complete understanding of the present disclosure and its advantages, reference is now made to the following description taken in conjunction with the accompanying drawings, in which.

DETAILED DESCRIPTION OF THE DRAWINGS

Parts may be manufactured according to certain design criteria. These design criteria may specify, for example, required dimensions and tolerance limits. Manufacturers may perform quality assurance tests to determine whether each manufactured part satisfies the design criteria. A manufacturer may fail a manufactured part if, for example, the dimensions of the manufactured part are not within the tolerance limits of the required dimensions.

Figure 1A:
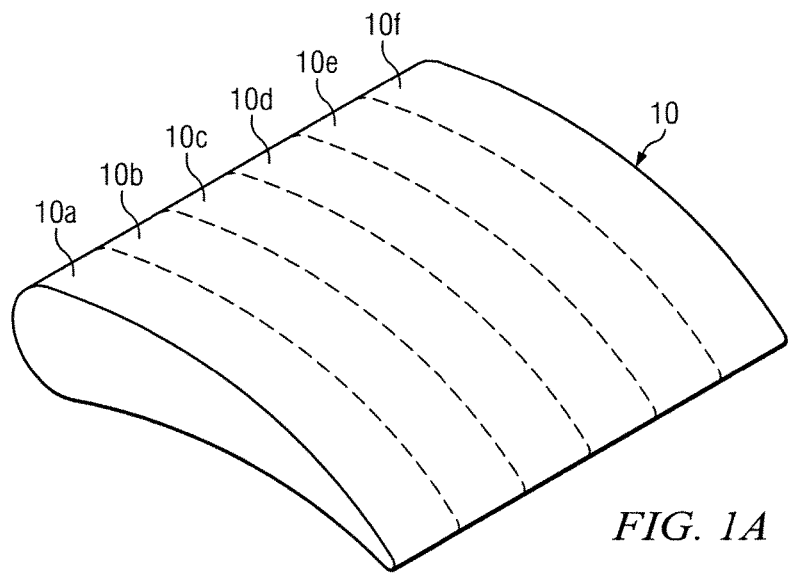
FIG. 1A shows a manufactured part.

FIG. 1A shows a manufactured part 10. In the example of FIG. 1A, manufactured part 10 has an aerodynamic surface. Manufactured part 10 may represent, for example, a helicopter rotor blade or airplane wing section. Quality assurance tests may be performed on manufactured part 10 to determine whether manufactured part 10 satisfies certain design criteria. In the example of FIG. 1A, quality assurance tests are performed on sections 10a-10f of manufactured part 10.

Figure 1B:
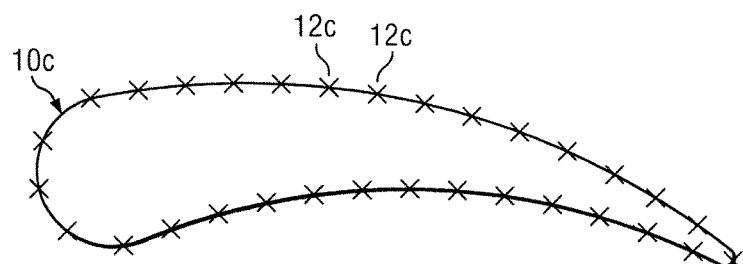
FIG. 1B shows points measured on one section of the manufactured part of FIG. 1A.

FIG. 1B shows a cross-section of section 10c of manufactured part 10. As explained above, quality assurance tests may be performed by comparing dimensions of the manufactured part with dimensions required by design criteria. In the example of FIG. 1B, the dimensions of section 10c may be determined from measured points 12c.

Points 12c of section 10c may be measured using a variety of different techniques. For example, points 12c may be measured using a coordinate measurement machine. A coordinate measurement machine is a device for measuring the physical geometrical characteristics of an object. A coordinate measurement machine may be controlled by an operator and/or computer. Measurements may be defined by a probe attached to the third moving axis of the coordinate measurement machine. Example probes may include mechanical, optical, laser, and white light probes.

Figure 1C:
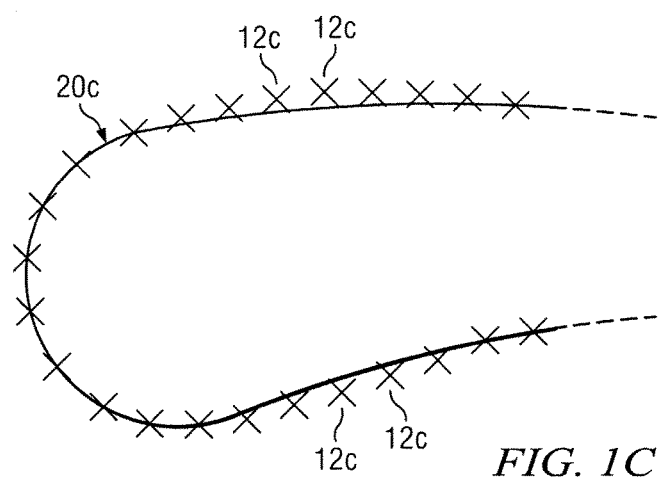
FIG. 1C shows the measured points of FIG. 1B plotted against a design profile for the section of FIG. 1B.

FIG. 1C shows the measured points 12c of FIG. 1B plotted against design profile 20c. In this example, design profile 20c may represent the design criteria. Quality assurance tests may be performed by measuring deviations between the measured points 12c and design profile 20c. Manufactured part 10 may fail the quality assurance tests if the measured deviations exceed the tolerance limits.

Design profile 20c, however, may represent a proxy for more important design criteria, such as aerodynamic performance. Measuring deviations between measured points 12c and design profile 20c may result in part 10 failing the quality assurance test even if such deviations do not materially change the aerodynamic performance of part 10. In some cases, most or all manufactured parts may fail quality assurance tests based on deviations in measured points even if the manufactured parts satisfy aerodynamic performance requirements. Accordingly, teachings of certain embodiments recognize the capability to perform quality assurance tests based on the aerodynamic performance of manufactured parts rather than deviations between measured points and design profiles.

Figure 2:
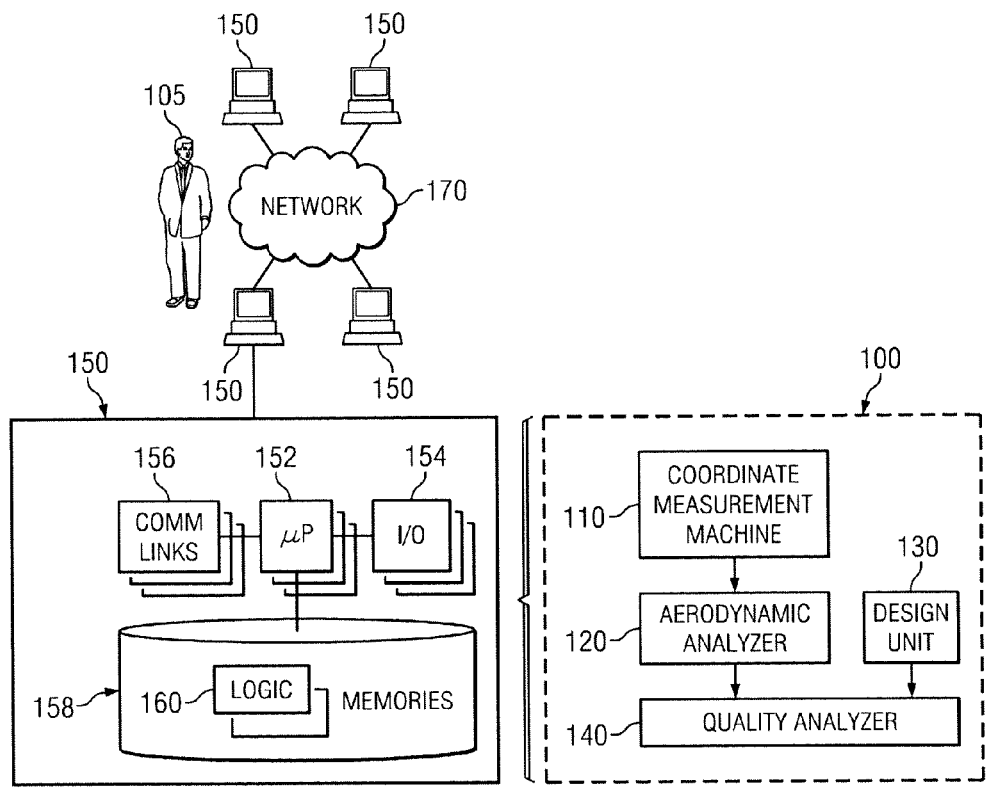
FIG. 2 shows a quality assurance system for analyzing the manufactured part of FIG. 1A according to one example embodiment.

FIG. 2 shows a quality assurance system 100 according to one example embodiment. The quality assurance system 100 of FIG. 1 features a coordinate measurement machine 110, an aerodynamic analyzer 120, a design unit 130, and a quality analyzer 140.

Coordinate measurement machine 110 measures the physical geometrical characteristics of part 10. In some example embodiments, coordinate measurement machine 110 measures points in each section of part 10.

Aerodynamic analyzer 120 analyzes the aerodynamic performance of part 10 based on the points measured by coordinate measurement machine 110. Aerodynamic analyzer 120 may use the measured points to reconstruct airfoil contours of the part.

The aerodynamic performance of part 10 may be analyzed using a variety of techniques. In one example embodiment, aerodynamic analyzer 120 analyzes the aerodynamic performance of part 10 according to blade element momentum theory. According to blade element momentum theory, the aerodynamic performance of a part, such as a rotor blade, may be analyzed by integrating across two-dimensional sections of the part. In this example, blade element momentum theory may account for blade twist by integrating across multiple sections along the blade. In another example embodiment, aerodynamic analyzer 120 analyzes the aerodynamic performance of part according to lifting line theory. According to lifting line theory, the aerodynamic performance of a part, such as a wing, may be determined by analyzing how the shape of the part changes air circulation about that part. Other examples may be used to analyze aerodynamic performance of part 10 as well.

Aerodynamic analyzer 120 may calculate a variety of different parameters that characterize the aerodynamic performance of part 10, such as the lift coefficient, drag coefficient, moment coefficient, thrust, and torque. In some embodiments, aerodynamic analyzer 120 may calculate parameters under different scenarios. For example, in one embodiment, aerodynamic analyzer 120 computes the maximum blade thrust for part 10 at the highest allowable blade torque for part 10.

Design unit 130 provides design performance specifications for part 10. The performance specifications may establish, for example, the nominal designed performance or the minimum required performance for part 10. In some embodiments, the performance specifications may establish the minimum required performance based on the nominal designed performance. For example, in one embodiment, the performance specifications may establish the minimum required performance as being within an allowable tolerance level of the nominal designed performance.

Examples of design performance specification parameters may include, but are not limited to, lift coefficient, drag coefficient, moment coefficient, thrust, and torque. The design performance specifications may also include ratios of multiple parameters or the values of parameters under certain conditions. For example, design unit 130 may identify a required blade thrust for part 10 at the highest allowable blade torque for part 10.

Quality analyzer 140 analyzes part 10 to determine whether the aerodynamic performance of part 10 satisfies minimum aerodynamic performance requirements. To make this determination, quality analyzer 140 compares the aerodynamic performance of part 10 to the minimum aerodynamic performance requirements. In some embodiments, quality analyzer 140 performs comparisons for each section of part 10. In other embodiments, quality analyzer 140 performs a comparison for the overall part 10.

The minimum aerodynamic performance requirements may be established through a variety of different techniques. In one example embodiment, the minimum aerodynamic performance requirements are defined based on the performance specifications received from design unit 130. In another example embodiment, the allowable tolerance limit is established based on how a specific part 10 compares to a group of manufactured parts. For example, in one embodiment, the aerodynamic performance for each part 10 may be plotted on a bell curve, and a passing grade for the parts may be set by the curve.

Quality analyzer 140 may also identify potential flaws in the manufacturing process. For example, quality analyzer 140 may recognize that a particular section often causes parts 10 to fail quality analysis. If a particular section often fails quality analysis, a flaw in the manufacturing process may be responsible, and correct the flaw may result in more parts 10 passing quality analysis.

Quality assurance system 100 may be implemented using one or more computer systems 150. Components of quality assurance system 100 may be combined and/or separated. Users 105 may access quality assurance system 100 through computer systems 150. Users 105 may include any individual, group of individuals, and/or entity that interacts with computer systems 150.

Computer system 150 may include processors 152, input/output devices 154, communications links 156, and memory 158. In other embodiments, computer system 150 may include more, less, or other components. Computer system 150 may be operable to perform one or more operations of various embodiments. Although the embodiment shown provides one example of computer system 150 that may be used with other embodiments, such other embodiments may utilize computers other than computer system 150. Additionally, embodiments may also employ multiple computer systems 150 or other computers networked together in one or more public and/or private computer networks, such as one or more networks 170.

Processors 152 represent devices operable to execute logic contained within a medium. Examples of processor 152 include one or more microprocessors, one or more applications, and/or other logic. Computer system 150 may include one or multiple processors 152.

Input/output devices 154 may include any device or interface operable to enable communication between computer system 150 and external components, including communication with a user or another system. Example input/output devices 154 may include, but are not limited to, a mouse, keyboard, display, and printer.

Network interfaces 156 are operable to facilitate communication between computer system 150 and another element of a network, such as other computer systems 150. Network interfaces 156 may connect to any number and combination of wireline and/or wireless networks suitable for data transmission, including transmission of communications. Network interfaces 156 may, for example, communicate audio and/or video signals, messages, internet protocol packets, frame relay frames, asynchronous transfer mode cells, and/or other suitable data between network addresses. Network interfaces 156 connect to a computer network or a variety of other communicative platforms including, but not limited to, a public switched telephone network (PSTN); a public or private data network; one or more intranets; a local area network (LAN); a metropolitan area network (MAN); a wide area network (WAN); a wireline or wireless network; a local, regional, or global communication network; an optical network; a satellite network; a cellular network; an enterprise intranet; all or a portion of the Internet; other suitable network interfaces; or any combination of the preceding.

Memory 158 represents any suitable storage mechanism and may store any data for use by computer system 150. Memory 158 may comprise one or more tangible, computer-readable, and/or computer-executable storage medium.

Examples of memory 158 include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

In some embodiments, memory 158 stores logic 160. Logic 160 facilitates operation of computer system 150. Logic 160 may include hardware, software, and/or other logic. Logic 160 may be encoded in one or more tangible, non-transitory media and may perform operations when executed by a computer. Logic 160 may include a computer program, software, computer executable instructions, and/or instructions capable of being executed by computer system 150. Example logic 160 may include any of the well-known OS2, UNIX, Mac-OS, Linux, and Windows Operating Systems or other operating systems. In particular embodiments, the operations of the embodiments may be performed by one or more computer readable media storing, embodied with, and/or encoded with a computer program and/or having a stored and/or an encoded computer program. Logic 160 may also be embedded within any other suitable medium without departing from the scope of the invention.

Various communications between computers 150 or components of computers 150 may occur across a network, such as network 170. Network 170 may represent any number and combination of wireline and/or wireless networks suitable for data transmission. Network 170 may, for example, communicate internet protocol packets, frame relay frames, asynchronous transfer mode cells, and/or other suitable data between network addresses. Network 170 may include a public or private data network; one or more intranets; a local area network (LAN); a metropolitan area network (MAN); a wide area network (WAN); a wireline or wireless network; a local, regional, or global communication network; an optical network; a satellite network; a cellular network; an enterprise intranet; all or a portion of the Internet; other suitable communication links; or any combination of the preceding. Although the illustrated embodiment shows one network 170, teachings of certain embodiments recognize that more or fewer networks may be used and that not all elements may communicate via a network. Teachings of certain embodiments also recognize that communications over a network is one example of a mechanism for communicating between parties, and any suitable mechanism may be used.

In operation, according to one example embodiment, quality assurance system 100 analyzes the quality of manufactured part 10. Coordinate measurement machine 110 measures coordinates on manufactured part 10. Aerodynamic analyzer 120 calculates aerodynamic performance data for the manufactured part 110 from the measured coordinates. Quality analyzer compares the calculated aerodynamic performance data with the minimum aerodynamic performance requirements. If the calculated aerodynamic performance data satisfies the minimum aerodynamic performance requirements, the manufactured part 10 is approved at step 240.

In some circumstances, quality assurance system 100 may determine that a particular part 10 or section of part 10 does not satisfy the minimum aerodynamic performance requirements. Normally, if a part does not pass quality assurance tests, that part may be discarded. Some parts, however, may be quite expensive, and it may make financial sense to fix the part rather than discard it.

Figure 3A:
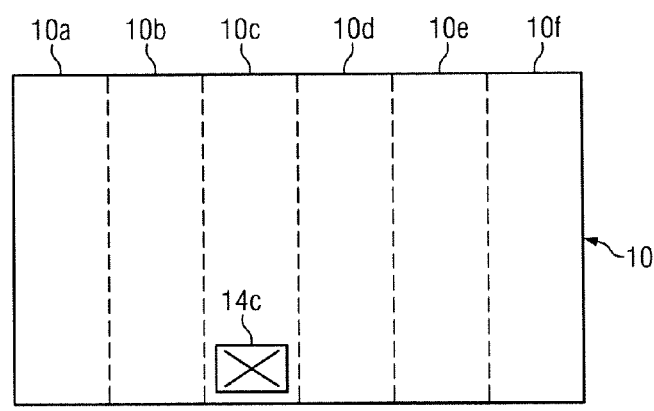
FIG. 3A shows the manufactured part of FIG. 1A with a modification.
Figure 3B:
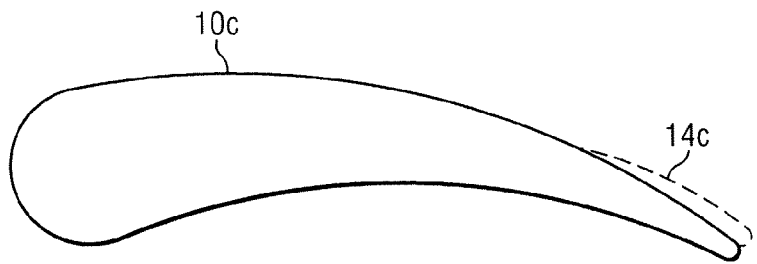
FIG. 3B shows the section of FIG. 1B having the modification of FIG. 3A.

Teachings of certain embodiments recognize the capability for quality assurance system 100 to recommend modifications to a manufactured part so that the manufactured part will meet the minimum aerodynamic performance requirements. FIG. 3A shows part 10 having a modification 14c. FIG. 3B shows a cross-section of section 10c of manufactured part 10 having modification 14c.

In some embodiments, the size, dimensions, and/or location of modification 14c may be suggested by quality assurance system 100. In one example embodiment, quality assurance system 100 recomputes aerodynamic performance using modified points and then suggests a modification to change the shape of part 10 to match the modified points. In another example embodiment, quality assurance system 100 stores information regarding one or more predefined modification shapes and determines whether one of the one or more predefined modification shapes sufficiently improves the aerodynamic performance. For example, the modification 14c of FIGS. 3A and 3B may be a preproduced material of certain dimensions, and quality assurance system 100 may compute the aerodynamic performance of part 10 with modification 14c to determine whether adding modification 14c allows part 10 to satisfy the minimum aerodynamic performance requirements.

Quality assurance system 100 may suggest different modifications depending on the aerodynamic performance of part 10. In one example embodiment, the moment of part (or of one or more sections of part 10) may not satisfy design requirements. In this example, placing modification 14c along the trailing edge of part 10 may change the camber of the airfoil of part 10 so as to correct the moment of part 10.

In the example of FIG. 3A, modification 14c fits within a single section 10c of part 10. In some embodiments, however, modification 14c may cross multiple sections of part 10.

The example modification 14c of FIGS. 3A and 3B is not drawn to scale. In some circumstances, the modifications may be relatively small when compared to the size of the part. For example, in some circumstances the modifications may be less than one inch long, as measured from the leading edge to the trailing edge of the modification. Such small modifications may not be apparent to the human eye when the part and modifications are painted.

After suggesting a modification, quality assurance system 100 may recalculate the aerodynamic performance of part 10 to determine whether adding the modification allows the part to satisfy the minimum aerodynamic performance requirements. In some embodiments, quality assurance system 100 suggests modifications and recalculates aerodynamic performance iteratively in order to reach an optimal modification. For example, quality assurance system 100 may store information regarding one or more predefined modification shapes and iteratively calculate aerodynamic performance for each predefined modification to determine which modification, if any, sufficiently improves aerodynamic performance.

In some embodiments, quality assurance system 100 determines an optimal modification and then selects the closest modification from available predefined modifications. In this example, quality assurance system 100 may recompute aerodynamic performance based on the closest predefined modification to determine whether the modification sufficiently improves aerodynamic performance.

Figure 4:
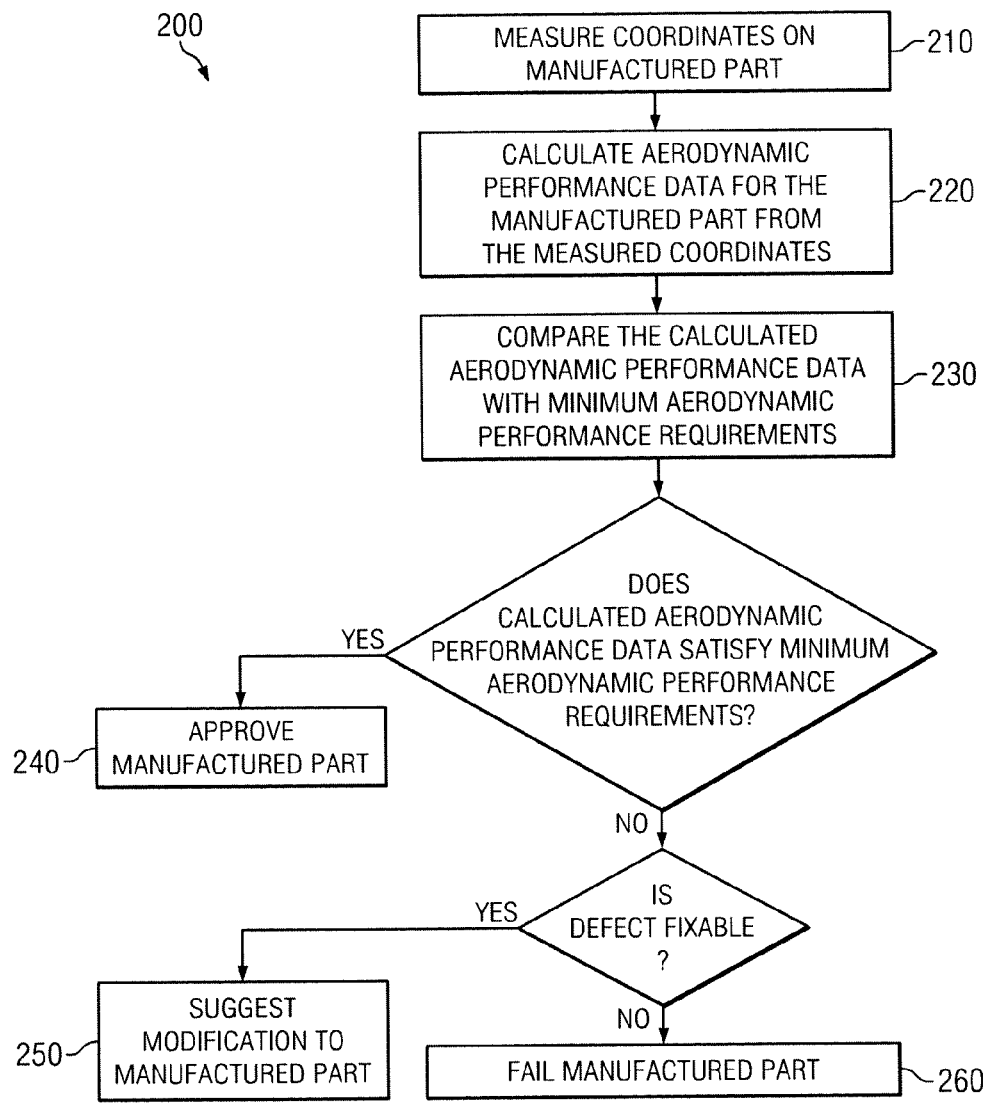
FIG. 4 shows a method for analyzing quality of a manufactured part according to one example embodiment.

FIG. 4 shows a method 200 for analyzing quality of a manufactured part according to one example embodiment. At step 210, coordinate measurement machine 110 measures coordinates on manufactured part 10. At step 220, aerodynamic analyzer 120 calculates aerodynamic performance data for the manufactured part 110 from the measured coordinates. At step 230, quality analyzer compares the calculated aerodynamic performance data with the minimum aerodynamic performance requirements.

If the calculated aerodynamic performance data satisfies the minimum aerodynamic performance requirements, the manufactured part 10 is approved at step 240. If not, quality analyzer 140 determines whether the defect in manufactured part 10 is fixable. If the defect is fixable, quality analyzer 140 suggests a modification to the manufactured part 10. If the defect is not fixable, quality analyzer 140 fails the manufactured part 10.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order.

Although several embodiments have been illustrated and described in detail, it will be recognized that substitutions and alterations are possible without departing from the spirit and scope of the present invention, as defined by the appended claims.

What is claimed is:

1. A quality assurance system comprising a quality analyzer operable to:
   receive a plurality of coordinates of a part that has been manufactured according to a design, the plurality of coordinates measured on a coordinate measurement machine and indicative of a geometric characteristic of the manufactured part;
   use the plurality of coordinates of the manufactured part measured on the coordinate measurement machine to determine aerodynamic performance data for the part;
   compare the aerodynamic performance data for the manufactured part to minimum aerodynamic performance requirements;
   determine that the aerodynamic performance data for the manufactured part does not satisfy minimum aerodynamic performance requirements using the comparison;
   in response to the determination that the aerodynamic performance data for the manufactured part does not satisfy minimum aerodynamic performance requirements:
      determine a second plurality of coordinates indicative of a modified shape of the manufactured part;
      use the second plurality of coordinates indicative of the modified shape of the manufactured part to recommend a modification to change the shape of the manufactured part;
      use the second plurality of coordinates of the manufactured part to determine second aerodynamic performance data for the manufactured part having the recommended modification;
      compare the second aerodynamic performance data for the manufactured part having the recommended modification to the minimum aerodynamic performance requirements; and
      determine that the second aerodynamic performance data for the manufactured part having the recommended modification satisfies the minimum aerodynamic performance requirements using the comparison; and
      in response to the determination that the second aerodynamic performance data satisfies the minimum aerodynamic performance requirements, use the determination to approve the manufactured part having the recommended modification.

2. The quality assurance system of claim 1, further comprising an aerodynamic analyzer operable to calculate the aerodynamic performance data from the plurality of coordinates measured on the manufactured part.

3. The quality assurance system of claim 2, wherein the aerodynamic analyzer is operable to calculate the aerodynamic performance data based at least in part on blade element momentum theory.

4. The quality assurance system of claim 1, wherein:
   the manufactured part has one or more measurement sections;
   the aerodynamic performance data comprises data for each of the one or more measurement sections; and
   the quality analyzer is operable to determine that the aerodynamic performance data for each measurement section does not satisfy minimum aerodynamic performance requirements associated with that measurement section.

5. The quality assurance system of claim 1, the quality analyzer further operable to determine that the aerodynamic performance data for the manufactured part does not satisfy the minimum aerodynamic performance requirements by determining that the aerodynamic performance data exceeds a predetermined tolerance of nominal designed performance specifications associated with the design.

6. The quality assurance system of claim 1, wherein the manufactured part is one part of a plurality of parts, the quality analyzer further operable to:
   receive aerodynamic performance data for the plurality of parts; and
   determine that the aerodynamic performance data for the one part does not satisfy the minimum aerodynamic performance requirements by comparing the aerodynamic performance data for the one part with aerodynamic performance data associated with other parts of the plurality of parts.

7. The quality assurance system of claim 1, wherein:
   the manufactured part is one part of a plurality of parts;
   receiving aerodynamic performance data comprises receiving aerodynamic performance data for the plurality of parts; and
   determining that the aerodynamic performance data for the part does not satisfy the minimum aerodynamic performance requirements comprises comparing the aerodynamic performance data for the one part with aerodynamic performance data associated with other parts of the plurality of parts.

8. The quality assurance system of claim 1, wherein the plurality of coordinates represent an actual geometric shape of the manufactured part.

9. A method for analyzing quality of a part, comprising:
   receiving, by a computer, a plurality of coordinates of a part that has been manufactured according to a design, the plurality of coordinates measured on a coordinate measurement machine and indicative of a geometric characteristic of the manufactured part;
   using, by the computer, the plurality of coordinates of the manufactured part measured on the coordinate measurement machine to determine aerodynamic performance data for the part;

comparing, by the computer, the aerodynamic performance data for the manufactured part to minimum aerodynamic performance requirements;

determining, by the computer, that the aerodynamic performance data for the manufactured part does not satisfy minimum aerodynamic performance requirements using the comparison;

in response to determining that the aerodynamic performance data for the manufactured part does not satisfy minimum aerodynamic performance requirements:

determining a second plurality of coordinates indicative of a modified shape of the manufactured part;

using the second plurality of coordinates indicative of the modified shape of the manufactured part to recommending a modification to change the shape of the manufactured part;

using the second plurality of coordinates of the manufactured part to determine second aerodynamic performance data for the manufactured part having the recommended modification; and comparing the second aerodynamic performance data for the manufactured part having the recommended modification to the minimum aerodynamic performance requirements;

determining that the second aerodynamic performance data for the manufactured part having the recommended modification satisfies the minimum aerodynamic performance requirements using the comparison; and in response to the determination that the second aerodynamic performance data satisfies the minimum aerodynamic performance requirements, using the determination to approve the manufactured part having the recommended modification.

10. The method of claim 9, wherein receiving the aerodynamic performance data comprises calculating, by the computer, the aerodynamic performance data from the plurality of coordinates measured on the manufactured part.

11. The method of claim 10, wherein the aerodynamic performance data is calculated based at least in part on blade element momentum theory.

12. The method of claim 9, wherein:
the manufactured part has one or more measurement sections;
the aerodynamic performance data comprises data for each of the one or more measurement sections; and
determining that the aerodynamic performance data for the manufactured part does not satisfy minimum aerodynamic performance requirements comprises determining that the aerodynamic performance data for each measurement section does not satisfy minimum aerodynamic performance requirements associated with that measurement section.

13. The method of claim 9, wherein determining that the aerodynamic performance data for the manufactured part does not satisfy the minimum aerodynamic performance requirements comprises determining that the aerodynamic performance data exceeds a predetermined tolerance of nominal designed performance specifications associated with the design.

14. A non-transitory computer readable medium comprising logic for execution, the logic, when executed by a processor, operable to:
receive a plurality of coordinates of a part that has been manufactured according to a design, the plurality of coordinates measured on a coordinate measurement machine and indicative of a geometric characteristic of the manufactured part;

use the plurality of coordinates of the manufactured part measured on the coordinate measurement machine to determine aerodynamic performance data for the part;

compare the aerodynamic performance data for the manufactured part to minimum aerodynamic performance requirements;

determine that the aerodynamic performance data for the manufactured part does not satisfy minimum aerodynamic performance requirements using the comparison;

in response to the determination that the aerodynamic performance data for the manufactured part does not satisfy minimum aerodynamic performance requirements:

determine a second plurality of coordinates indicative of a modified shape of the manufactured part;

use the second plurality of coordinates indicative of the modified shape of the manufactured part to recommend a modification to change the shape of the manufactured part;

use the second plurality of coordinates of the manufactured part to determine second aerodynamic performance data for the manufactured part having the recommended modification;

compare the second aerodynamic performance data for the manufactured part having the recommended modification to the minimum aerodynamic performance requirements; and determine that the second aerodynamic performance data for the manufactured part having the recommended modification satisfies the minimum aerodynamic performance requirements using the comparison; and in response to the determination that the second aerodynamic performance data satisfies the minimum aerodynamic performance requirements, use the determination to approve the manufactured part having the recommended modification.

15. The computer-readable medium of claim 14, wherein:
the manufactured part has one or more measurement sections;
the aerodynamic performance data comprises aerodynamic performance data for each of the one or more measurement sections; and
the logic, when executed, is operable to determine that the aerodynamic performance data for each measurement section does not satisfy the minimum aerodynamic performance requirements associated with that measurement section.

16. The computer-readable medium of claim 14, the logic, when executed, being further operable to determine that the aerodynamic performance data for the manufactured part does not satisfy the minimum aerodynamic performance requirements by determining that the aerodynamic performance data exceeds a predetermined tolerance of nominal designed performance specifications associated with the design.

17. The computer-readable medium of claim 14, wherein:
the manufactured part is one part of a plurality of parts;
the logic, when executed, is operable to receive aerodynamic performance data for the plurality of parts; and
the logic, when executed, is operable to determine that the aerodynamic performance data for the one part does not satisfy the minimum aerodynamic performance requirements by comparing the aerodynamic performance data for the one part with aerodynamic performance data associated with other parts of the plurality of parts.

* * * * *